United States Patent

Benco et al.

Patent Number: 6,115,675
Date of Patent: Sep. 5, 2000

[54] DOUBLE INTERPOLATION ANTI-SKEW COMPENSATION OF SAMPLED ANALOG DATA POINTS IN A PROTECTIVE RELAY

[75] Inventors: Joseph P. Benco, Germansville, Pa.; James D. Stoupis, Raleigh, N.C.

[73] Assignee: ABB Power T&D Company Inc., Raleigh, N.C.

[21] Appl. No.: 09/033,406

[22] Filed: Mar. 2, 1998

[51] Int. Cl.[7] .......................... G06F 19/00; G01R 31/00
[52] U.S. Cl. ................ 702/59; 702/58; 702/106; 702/126; 324/76.24; 324/76.29; 324/76.47
[58] Field of Search ............................... 702/57, 58, 59, 702/60, 64, 106, 126; 324/76.21, 76.24, 76.39, 76.47, 76.55, 76.74; 361/79, 81, 86, 87; 341/118, 122, 141

[56] References Cited

U.S. PATENT DOCUMENTS

| | | | |
|---|---|---|---|
| 4,547,726 | 10/1985 | Premerlani | 324/76.24 |
| 4,715,000 | 12/1987 | Premerlani | 702/126 |
| 4,723,216 | 2/1988 | Premerlani | 702/126 |
| 5,428,549 | 6/1995 | Chen | 702/59 |
| 5,477,163 | 12/1995 | Kliman | 324/772 |
| 5,514,978 | 5/1996 | Koegl et al. | 702/58 |
| 5,517,106 | 5/1996 | Longini | 324/142 |

*Primary Examiner*—Marc S. Hoff
*Assistant Examiner*—Bryan Bui
*Attorney, Agent, or Firm*—Woodcock Washburn Kurtz Mackiewicz & Norris LLP

[57] ABSTRACT

A protective relay system comprises current and voltage transducers 10, filters 12, and a multiplexor 14, the latter outputting an interleaved stream of analog phase current and voltage signal samples, as well as neutral current samples. The analog multiplex output by the multiplexor 14 is digitized by an analog-to-digital converter 16. The output of the analog-to-digital converter 16 is fed to a digital signal processing block 18. The multiplexor necessarily introduces a time-skew between the successive samples for each channel and also introduces a time-skew between the respective channels. The system corrects the sample-to-sample time-skew for each channel, and then derives current and voltage phasors from the time-skew corrected data.

12 Claims, 3 Drawing Sheets

DOUBLE INTERPOLATION ANTI-SKEW COMPENSATION OF SAMPLED ANALOG DATA POINTS IN A PROTECTIVE RELAY

FIELD OF THE INVENTION

The present invention relates generally to the field of protective relaying, and relates more particularly to techniques for correcting time-skewed analog voltage and current samples, which techniques may be employed in generator, transmission, transformation, and distribution protective relaying.

BACKGROUND OF THE INVENTION

Protective relaying generally involves performing one or more of the following functions in connection with a protected power or energy system: (a) monitoring the system to ascertain whether it is in a normal or abnormal state; (b) metering, which involves measuring certain electrical quantities for operational control; (c) protection, which typically involves tripping a circuit breaker in response to the detection of a short-circuit condition; and (d) alarming, which provides a warning of some impending problem. Fault determination involves measuring critical system parameters and, when a fault occurs, quickly making a rough estimate of the fault location and of certain characteristics of the fault so that the power source can be isolated from the faulted line; thereafter, the system makes a comprehensive evaluation of the nature of the fault. A fault occurs when electrical current is diverted from its normal path due to external factors.

The basic principles of protective relay operation are well known. Typically, measured voltage and current values are obtained with the aid of measuring transformers in a measuring station located adjacent to a protected line. Present-day techniques employ analog-to-digital conversion and filtering of the measured values. The filtered digital values are then processed by various equations to determine various conditions of the power line. For example, in a faulty power line, the digital values are used to determine the nature and the magnitude of the fault.

Protective relays are employed to protect multiple phase systems. Moreover, the relays generally operate on data (voltage and current samples) from the multiple phases simultaneously to determine line conditions. The commonly used equations, such as Discrete Fourier Transforms, assume that all of the data from each phase is sampled at the same time. However, where it is desirable to keep the cost of manufacturing the relays to a minimum, a single analog-to-digital conversion (ADC) circuit may be employed. This single circuit then multiplexes among the various phases. The result of multiplexing into a single ADC circuit is to skew the samples in time. The amount of skew will depend upon the speed of the ADC circuit.

Skewed samples can result in a variety of measurement inaccuracies. For example, the exact impedance of a fault will be less accurate than it would be if the samples were not skewed. The skew error can also effect costs. For example, the time and associated costs required to find and repair power line faults will be affected by the inaccurate fault impedance calculation.

It has been recognized that the skew can be corrected by taking corrective measures to shift the sampled points in time. U.S. Pat. No. 5,428,549 (Chen) describes a protective relay fault detection system that uses one such skew technique in a system that samples a multiple-phase electric transmission system with a single ADC circuit. Chen provides a fault location system for locating faults associated with one or more conductors of a power distribution system, the system having an associated protective relay at a known location along the conductors. According to Chen, such a system comprises a multiplexor for obtaining multiple samples of a plurality of phase currents and voltages, the multiplexor introducing a time-skew into at least some of the samples, and an analog-to-digital convertor for converting the samples to digital sample data. Chen derives time-skew corrected sample data from the digital sample data. Thereafter, Chen derives phasor data for the currents and voltages on the basis of the time-skew corrected data and uses that corrected data to determine a fault location.

In one preferred embodiment of the Chen invention, as best illustrated in FIG. 1, the means for deriving time-skew corrected sample data from the digital sample data comprises estimating the value of a desired sample ($V_{i+1}(t)$) from the equation:

$$V_{i+1}(t) = (sk/dts)V_i(t+sk) + (V_{i+1}(t+sk))(dts-sk)/dts,$$

where "sk" represents the time skew between the corrected sample $V_i+1(t)$ and a time-skewed sample $V_{i+1}(t+sk)$, and "dts" represents a known sampling interval between samples, e.g., $V_{i+1}(t)$ and previous sample $V_i(t)$. Essentially, Chen takes two measured samples, $V_i(t+sk)$ and $V_{i+1}(t+sk)$, and uses the two measured skewed points to estimate a non-skewed value $V_{i+1}(t)$. Chen accomplishes the estimate by using linear interpolation. Chen assumes that the corrected $V_i+1(t)$ is on a line 5 that bisects the points $V_i(t+sk)$ and $V_{i+1}(t+sk)$. The error in Chen's estimate is the difference between the lines 6 and 5 at the point $V_{i+1}(t)$.

As previously noted, the skewed samples introduce inaccuracies into electrical measurement equipment, such as protective relays. Therefore, it is desirable to make the samples as accurate as possible. Of course, the desired accuracy must be balanced against the cost to produce the relay. Accordingly, there is a need for an improved technique for correcting time skew in a protective relay having a single ADC circuit.

SUMMARY OF THE INVENTION

The present invention provides a system and method for obtaining a digital representation at a time t of one of an analog voltage and current associated with one or more conductors of an electric power generation, transmission, transformation, or distribution system. The system and method has an associated protective relay at a known location along the conductors. The apparatus for use with the system and method comprises a multiplexor having a plurality of channels wherein each channel has an analog voltage or current signal from the conductors, and the multiplexor selectively outputs a selected signal from one of the channels. The apparatus also comprises an analog-to-digital convertor in electrical communication with the multiplexor for converting the selected signal to a digital sample y. The multiplexor and analog-to-digital converter introduce a time-skew equivalent to the difference between the actual sample time $t_a$ and the time t into at least some of said samples. Means are provided in communication with said analog-to-digital convertor for deriving time-skew corrected sample data p' from the digital sample y, wherein the means for deriving time-skew corrected sample data from the digital sample y comprises means for determining the value of a point p' at time t from a sample $y_k$ taken at time $t_a$ wherein p' is derived from three consecutive time skewed samples $y_k$, $y_{k-1}$, and $y_{k-2}$ such that p' is determined as the weighted average of two estimates $p_1$ and $p_2$ of the corrected sample data, wherein $p_2$ is estimated from a straight line intersecting two skewed samples $y_{k-1}$ and $y_{k-2}$ and $p_1$ is estimated from a straight line intersecting two time skewed samples $y_k$ and $y_{k-1}$.

The estimate $p_1$ is determined as:

$$p_1 = y_{k-1} + \frac{x_1 - x_3}{x_3}(y_k - y_{k-1})$$

where $x_3$ is a time interval between samples y; and $x_1$ is equivalent to $2x_3$ minus the time $(t-t_a)$.

The value of point $p_2$ is determined as follows:

$$p_2 = y_{k-2} + \frac{x_1}{x_3}(y_{k-1} - y_{k-2}).$$

Finally, p' is determined as:

$$p' = \frac{x_1}{2x_3}p_1 + \frac{x_2}{2x_3}p_2.$$

BRIEF DESCRIPTION OF THE DRAWINGS

The foregoing summary, as well as the following detailed description of the preferred embodiment, is better understood when read in conjunction with the appended drawings. For the purpose of illustrating the invention, there is shown in the drawings an embodiment that is presently preferred, it being understood, however, that the invention is not limited to the specific methods and instrumentalities disclosed.

In the drawings.

DETAILED DESCRIPTION OF A PREFERRED EMBODIMENT

Figure 2:
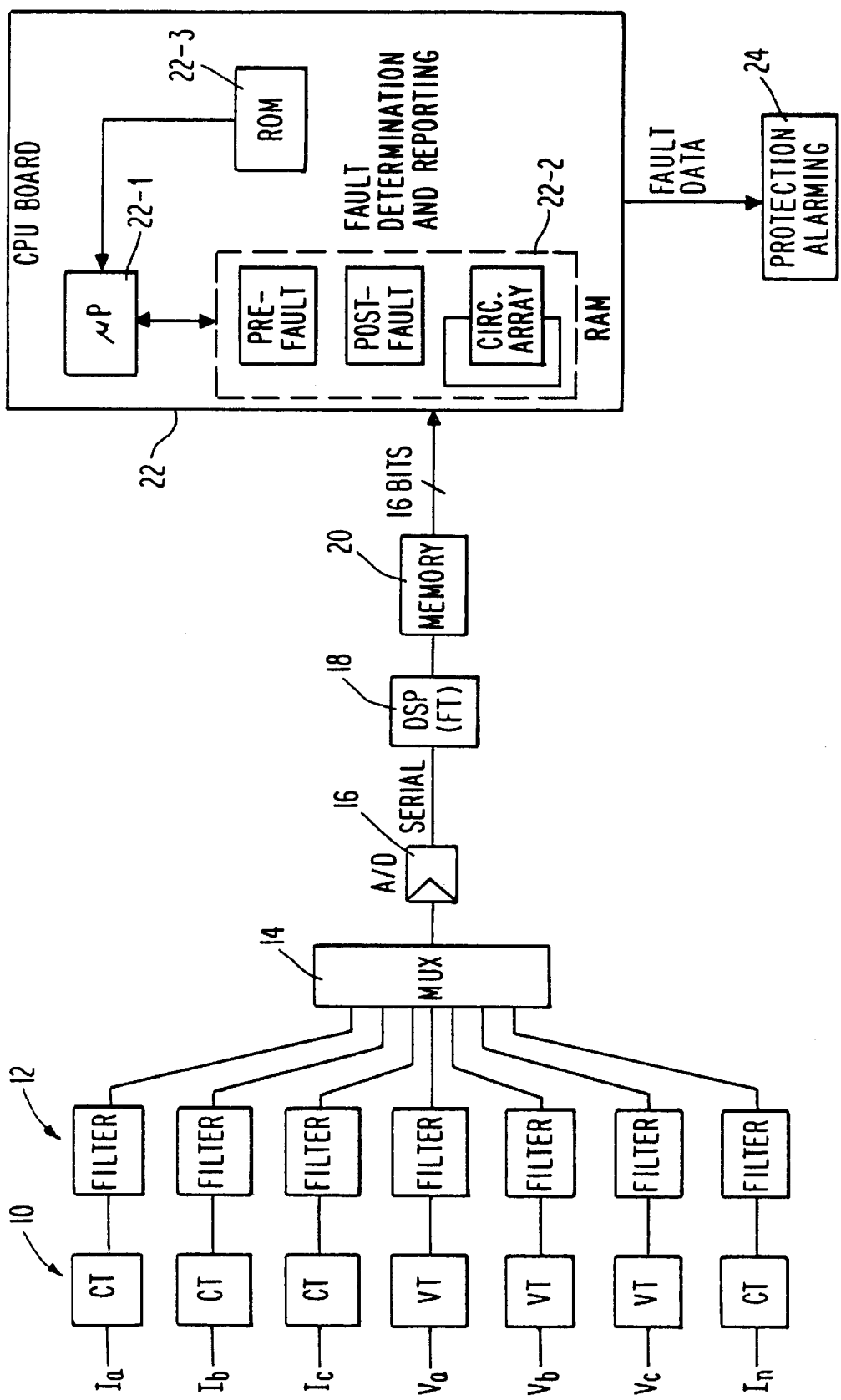
FIG. 2 is a block diagram of a system for correcting skewed samples in accordance with the present invention.

FIG. 2 depicts a preferred embodiment of a fault location system that could be implemented, for example, as a portion of a protective relay. The present invention is described below with reference to the relay to illustrate its operation. However, the present invention is by no means limited to the use in fault protection but is also useful in other measurement systems wherein time skew correction is required. For example, the present invention could be useful in digital fault recorders, oscillographic recorders, power quality meters, and control devices generally.

The fault location system of FIG. 2 comprises current and voltage transducers 10, filters 12, and a multiplexor 14. Multiplexor 14 has a number of input channels, each connected to an output of a respective current or voltage transducer 10. Multiplexor 14 outputs an interleaved stream of analog phase current and voltage signal samples, as well as neutral current samples, at a predetermined rate that depends primarily on the conversion speed of ADC 16. For example, a typical conversion speed may be about a 13 $\mu$second rate. The analog multiplexed signal output by multiplexor 14 is connected to the input of ADC 16. ADC 16 then, of course, samples and digitizes the analog input signal into a digital output signal. This digital output signal is connected to a digital signal processor block 18 for processing. Digital signal processing block 18 employs a transform, such as a Discrete Fourier Transform, to produce phasor data for each of the sampled channels. The phasor data is stored in a memory 20. The phasor data in the memory 20 is fed via a 16-bit data bus to a central processing unit (CPU) board 22. The CPU board 22 includes a microprocessor 22-1, random access memory 22-2, and read only memory (ROM) 22-3. The (ROM) 22-3 contains program code controlling the microprocessor 22-1 in performing operations such as fault typing, fault location, and reporting functions. The CPU board 22 outputs fault data to a protection/alarming block 24 that performs protection and alarming functions such as tripping a circuit breaker or sounding an alarm as appropriate.

It is desirable to sample each channel of the multiplexor 14 at a predetermined sampling rate, which rate depends on the frequency of the signal to be measured. Therefore, each channel will have a sampling rate between sampled data points. For example, a typical sampling rate for a protective relay input is about 521 $\mu$seconds, i.e., each input channel of multiplexor 14 will be sampled once every 521 $\mu$seconds. Accordingly, using the exemplary values of a 13 $\mu$second conversion rate and a 521 $\mu$second sampling rate, in a seven channel multiplexor, there will be a burst of seven 13 $\mu$second samples every 521 $\mu$seconds.

Figure 3:
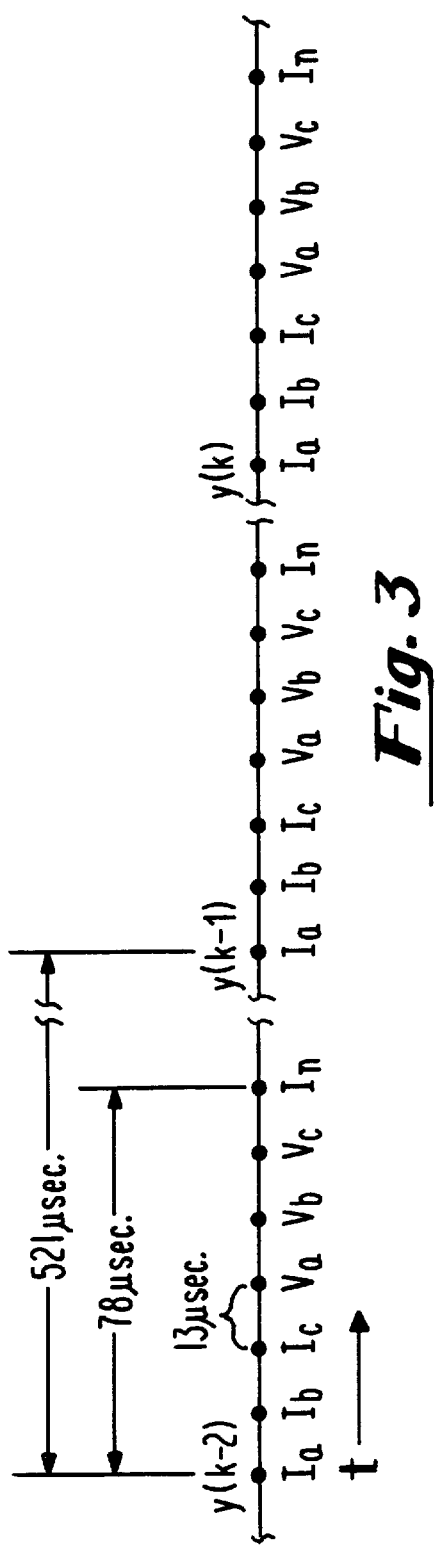
FIG. 3 is a time line of the sampling from the multiplexor of FIG. 2.
Figure 1:
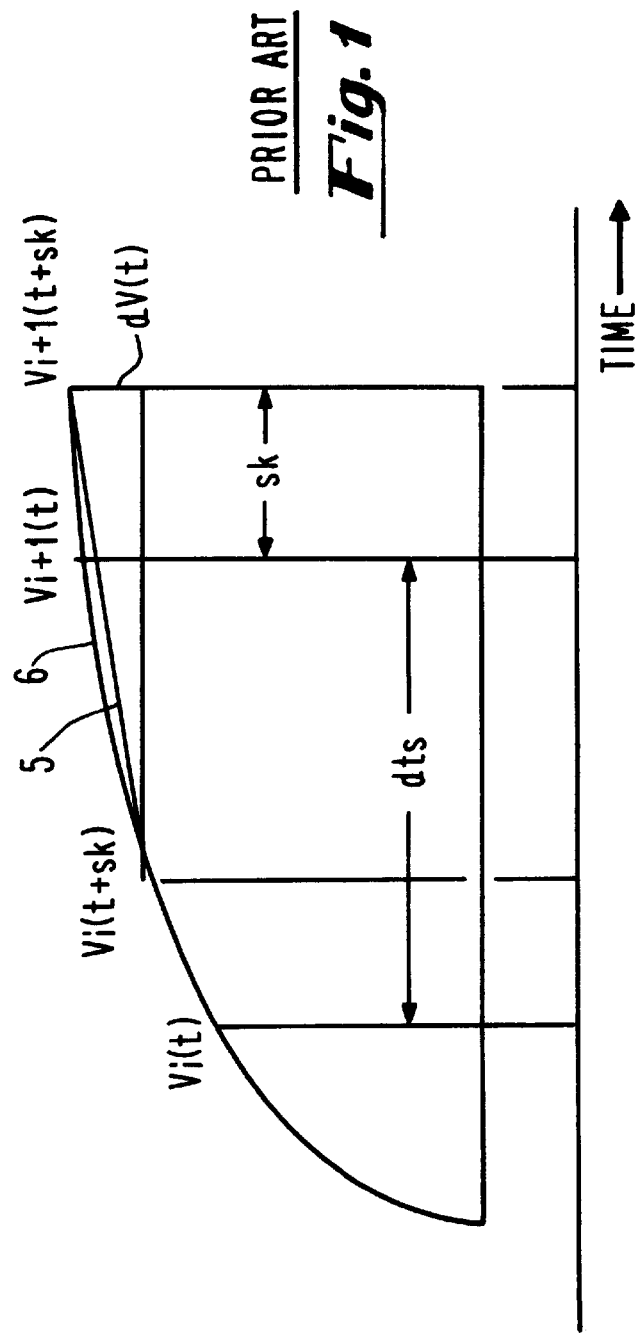
FIG. 1 is an illustration of a prior art anti-skew technique.

The operation of multiplexor 14 is further illustrated with the graph of FIG. 3. That graph shows a time line for three sampling periods (k, k−1, and k−2) during each of the sample periods each channel of multiplexor 14 is sampled. Each channel is sampled during a 13 $\mu$second sampling period until all channels have been sampled. The process is repeated at the sampling rate of every 521 $\mu$seconds. The time line shows the sampling process over a three sample period. In this example, the conversion of the seven multiplexor channels is completed in a period of 78 $\mu$seconds (i.e., 6 intervals between 7 channels times 13 $\mu$seconds). As described above, because all seven channels are not sampled simultaneously, a time skew is introduced into the channels relative to each other. Accordingly, if the samples are not adjusted to a reference time, the channels values cannot be compared to each other without introducing errors because the samples are time-skewed relative to each other over the 78 $\mu$second time period.

According to the present invention, the relative time-skew of each sampled data point is corrected by preselecting one of the multiplexor channels as a reference channel and adjusting the values of the other channels back to the time of the reference channel. Of course, the amplitude of the signal for the time-skew adjusted samples must also be corrected to a value as near as the amplitude that the signal would have had if it were sampled at the same time as the reference channel. For example, assuming that channel $V_b$ is the reference channel (see FIG. 2), channel $I_a$ will have to move forward in time by 52 $\mu$seconds (13 $\mu$seconds times 4 channels). Similarly, channel $I_n$ will have to move backward in time by 26 $\mu$seconds (13 $\mu$seconds times 2 channels).

Figure 4:
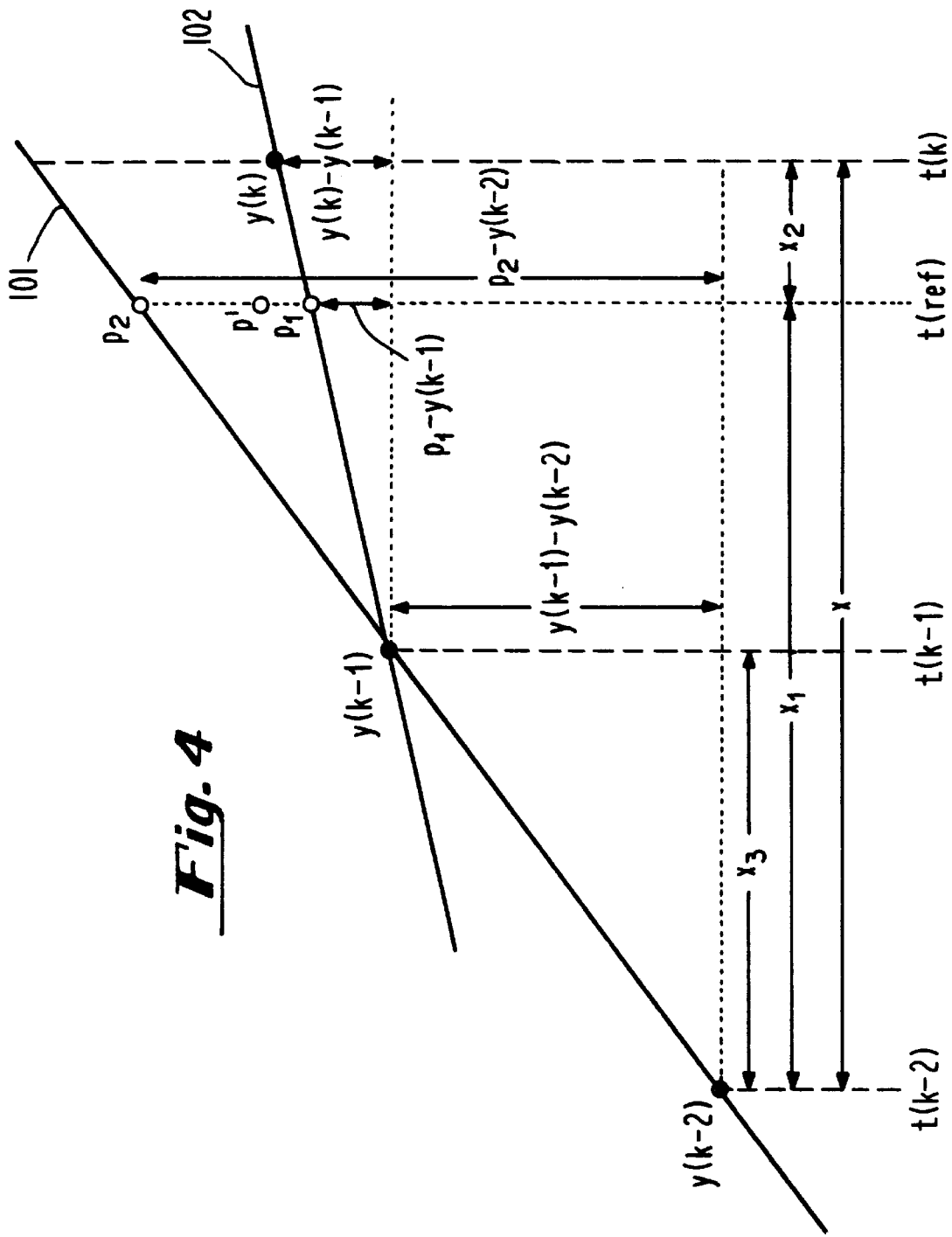
FIG. 4 is a graph illustrating of the operation of the anti-skew technique of the present invention.

Referring to FIG. 4, a method of correcting skew in accordance with the present invention is graphically depicted. In essence, the point p' is a skew corrected value for y(k), which is corrected from time t(k) to time t(ref). The magnitude of p' is derived from y(k) in conjunction with the two previous skewed points y(k−1) and y(k−2), where y is a placeholder for the measured channel voltage or current and k is the sample number. As the graph of FIG. 4 illustrates, p' is determined from two straight lines 101 and 102. The use of two straight lines provides more accurate results while reducing the computational burden. For each line 101, 102 an estimate for the unskewed (i.e., the corrected) sample point is made. For example, line 101 determines the unskewed sample point to be $p_2$; whereas line 102 determines the unskewed sample point to be $p_1$. The two intermediate corrected sample points $p_1$, $p_2$ are then weighted together to find a better estimate of the unskewed point p'.

As indicated on the graph, $p_1$ lies between the measured values y(k) and y(k−1). By contrast, $p_2$ is projected after the points y(k−1) and y(k−2). Accordingly, the present invention assumes that point $p_1$ is closer to the actual value and gives it more weight in estimating p'. The equations for determining p' are given below:

$$p' = K_1 p_1 + K_2 p_2$$

where:

The values $p_1$ and $p_2$ are intermediate estimates for p' that are weighted by the values $K_1$ and $K_2$ respectively. The value $p_1$ is determined as:

$$p_1 = y_{k-1} + \frac{x_1 - x_3}{x_3}(y_k - y_{k-1})$$

And, the value $p_2$ is determined as:

$$p_2 = y_{k-2} + \frac{x_1}{x_3}(y_{k-1} - y_{k-2})$$

where:

$y_k$, $y_{k-1}$, and $y_{k-2}$ are sampled values from a given channel in which $y_k$ is the skewed sample point to be corrected and $y_{k-1}$ and $y_{k-2}$ are the two previous sampled point;

$x_3$ is the sampling rate (e.g., 521 μ seconds); and, $x_1$ is equivalent to twice the sampling rate (e.g., 1042 μ seconds) minus the distance to the reference channel (e.g., n*13 μ seconds), that is $x_1 = 2x_3 - nR$.

The weighted coefficients ($K_1$ and $K_2$) for $p_1$ and $p_2$ are determined as follows:

$$K_1 = \frac{x_1}{2x_3}$$

and $$K_2 = \frac{x_2}{2x_3}$$

where:

$x_2 = nR$;

n is the number of channels from the reference channel (e.g., 1–7 and can be a negative or positive number depending on whether the reference channel is backward or forward); and, R is the channel rate (e.g., 13 μ seconds). Alternatively, p' can be expressed as:

$$p' = p_1 + \frac{x_2}{2x_3}(p_2 - p_1)$$

Because $$\frac{x_1}{2x_3}p_1 + \frac{x_2}{2x_3}p_2 = \frac{2x_3 - x_2}{2x_3}p_1 + \frac{x_2}{2x_3}p_2$$

The right side of the above equation can be rewritten as:

$$\frac{2x_3}{2x_3}p_1 - \frac{x_2}{2x_3}p_1 + \frac{x_2}{2x_3}p_2.$$

Once the samples have been corrected for time skew by adjusting them all to the time of the reference channel, the adjusted samples can be compared to one another. For example, the adjusted samples can then be used in a Discrete Fourier Transform to determine fault impedance and the like.

The following examples illustrate the operation of the anti-skew technique of the present invention on various samples taken at different distances from the reference channel. The examples illustrate the accuracy of the anti-skew technique in correcting a channel back to the reference channel. The input values for the examples is a sine wave of the form y=5800*sint(wt).

EXAMPLE 1

(reference channel is one channel back)

Measured values:

$y_{k-2} = 5369.3$; $y_{k-1} = 5694.0$; and $y_k = 5799.9$;

Actual Value for p'=5800;

$$p_1 = 5694.0 + (5799.9 - 5694.0)\frac{521 - 13 \times 1}{521}$$
$$= 5797.26$$

$$p_2 = 5369.3 + (5694.0 - 5369.3)\frac{1042 - 13 \times 1}{521}$$
$$= 6010.60$$

$$p' = p_1 + (p_2 - p_1)\frac{x_2}{2x_3}$$
$$= 5802.82 + (6026.57 - 5802.82)\frac{13 \times (-1)}{1042}$$
$$= 5800.03$$

The resulting error in this example is −0.03 (i.e., 5800−5800.03).

EXAMPLE 3

(reference channel is five channels back)

Measured values:

$y_{k-2} = 5411.3$; $y_{k-1} = 5714.6$; and, $y_k = 5798.3$;

Actual Value for p'=5800;

$$p_1 = 5714.6 + (5798.3 - 5714.6)521 - \frac{13 \times 5}{521} = 5787.86$$

$$p_2 = 5411.3 + (5714.6 - 5411.3)1042 - \frac{13 \times 5}{521} = 5980.06$$

EXAMPLE 4

(reference channel is five channels forward)

Measured values:

$y_{k-2} = 5302.5$; $y_{k-1} = 5659.1$; and, $y_k = 5798.3$;

Actual Value for p'=5800;

$$p_1 = 5659.1 + (5798.3 - 5659.1)\frac{521 - 13 \times (-5)}{521}$$
$$= 5815.67$$

$$p_2 = 5302.5 + (5659.1 - 5302.5)\frac{1042 - 13 \times (-5)}{521}$$
$$= 6060.19$$

$$p' = p_1 + (p_2 - p_1)\frac{x_2}{2x_3}$$
$$= 5815.67 + (6060.19 - 5815.67)\frac{13 \times (-5)}{1042}$$
$$= 5800.42$$

The resulting error in this example is −0.42 (i.e., 5800−5800.42).

Further experimental results were performed over full cycles of a sine wave with an amplitude of sqrt(2). The results of those experiments showed that in an example of a sine wave signal with no noise, the maximum error in such a case is about two counts of the ADC, which corresponds to a relative error of 0.024%. In an example of a sine wave signal with 1% white noise, the maximum error in such a case is approximately 150 counts of the ADC, or a maximum relative error of 1.83%.

The above description of preferred embodiments is not intended to implicitly limit the scope of protection of the following claims. Thus, for example, except where they are expressly so limited, the following claims are not limited to applications involving fault detection.

What is claimed is:

1. A system for obtaining a digital representation at a time t of one of an analog voltage and current associated with one or more conductors of an electric power generation, transmission, transformation, or distribution system, said system comprising:

a multiplexor having a plurality of channels wherein each channel has one of an analog voltage or current signal from said conductors, said multiplexor selectively outputting a selected signal from one of said channels;

an analog-to-digital convertor in electrical communication with said multiplexor for converting said selected signal to a digital sample y, said multiplexor and analog-to-digital converter introducing a time-skew equivalent to the difference between the actual sample time $t_a$ and the time t into at least some of said samples; and means in communication with said analog-to-digital convertor for deriving time-skew corrected sample data p' from said digital sample y;

wherein said means for deriving time-skew corrected sample data from said digital sample y comprises means for determining the value of a point p' at time t from a sample $y_k$ taken at time $t_a$ wherein p' is derived from three consecutive time skewed samples $y_k$, $y_{k-1}$, and $y_{k-2}$ such that p' is determined as the weighted average of two estimates $p_1$ and $p_2$ of the corrected sample data, wherein $p_2$ is estimated from a straight line intersecting two skewed samples $y_{k-1}$ and $y_{k-2}$ and $p_1$ is estimated from a straight line intersecting two time skewed samples $y_k$ and $y_{k-1}$.

2. The system as recited in claim 1 wherein the estimate $p_1$ is determined as:

$$p_1 = y_{k-1} + \frac{x_1 - x_3}{x_3}(y_k - y_{k-1})$$

where
   $x_3$ is a time interval between samples y;
   $x_1$ is equivalent to $2x_3$ minus the time (t−$t_a$).

3. The system as recited in claim 2 wherein the value of point $p_2$ is determined as follows:

$$p_2 = y_{k-2} + \frac{x_1}{x_3}(y_{k-1} - y_{k-2}).$$

4. The system as recited in claim 3 wherein p' is determined as:

$$p' = \frac{x_1}{2x_3}p_1 + \frac{x_2}{2x_3}p_2.$$

5. The system as recited in claim 3 wherein the value for point p' is determined substantially as:

$$p' = p_1 + \frac{x_2}{2x_3}(p_2 - p_1).$$

6. The system of claim 1 wherein said means for deriving time-skew corrected sample data comprises a digital signal processor.

7. The system of claim 1, wherein said system comprises one of a protective relay, a digital fault recorder, an oscillographic recorder, a power quality meters, and a control device at a known location along said conductors.

8. In a protective relay wherein a plurality of channels are sampled with a single analog-to-digital converter, a method of adjusting the value of a sampled channel to approximate a value at a reference time, comprising the steps of:

(a) acquiring at least three samples from a first channel, wherein the time between each sample is substantially constant;

(b) determining a first estimated value for the first channel at the reference time along a line bisecting a first and second of the at least three samples;

(c) determining a second estimated value for the first channel at the reference time along a line bisecting a second and third of the at least three samples; and, (d) selecting the adjusted sampled channel value as a weighted average of the first and second estimated values.

9. The method of claim 8 wherein the step (b) of determining a first estimated value $p_1$ comprises the steps of:

(b1) acquiring a first sample $y_k$;
   (b2) acquiring a second sample $y_{k-1}$;
   (b3) determining a time interval $x_3$ between samples y;
   (b4) determining a time interval $x_1$ as the difference between $2x_3$ minus the difference between the reference time and the time of the sample $y_k$; and
   (b5) determining the value of the first estimate value as:

$$p_1 = y_{k-1} + \frac{x_1 - x_3}{x_3}(y_k - y_{k-1}).$$

10. The method of claim 8 wherein the step (c) of determining a second estimated value $p_2$ comprises the steps of:

(c1) acquiring a first sample $y_{k-1}$;

(c2) acquiring a second sample $y_{k-2}$;

(c3) determining a time interval $x_3$ between samples y;

(c4) determining a time interval $x_1$ as the difference between $2x_3$ minus the difference between the reference time and the time of the sample $y_k$;

(c5) calculating the value of the first estimate value as:

$$p_2 = y_{k-2} + \frac{x_1}{x_3}(y_{k-1} - y_{k-2}).$$

11. The method of claim 8 wherein the step (d) comprises determining the value for p' as:

$$p' = \frac{x_1}{2x_3}p_1 + \frac{x_2}{2x_3}p_2.$$

12. The method of claim 8 wherein said protective relay is coupled to a power line and wherein said adjusted values of the sample channel are used to determine the distance to a fault on said power lines.

* * * * *

UNITED STATES PATENT AND TRADEMARK OFFICE
CERTIFICATE OF CORRECTION

PATENT NO. : 6,115,675
DATED : September; 5, 2000
INVENTOR(S) : Joseph P. Benco and James D. Stoupis It is certified that error appears in the above-indentified patent and that said Letters Patent is hereby corrected as shown below:

Col. 6, the equations at lines 56 through 60 should read:

$$p_1 = 5714.6 + (5798.3 - 5714.6)\frac{521 - 13x5}{521} = 5787.86$$

$$p_2 = 5411.3 + (5714.6 - 5411.3)\frac{1042 - 13x5}{521} = 5980.06$$

Signed and Sealed this

Eighth Day of May, 2001

Attest:

NICHOLAS P. GODICI

Attesting Officer

Acting Director of the United States Patent and Trademark Office